July 15, 1958 D. J. HAMILTON 2,843,743
PULSE GENERATOR
Filed Nov. 4, 1955

DOUGLAS J. HAMILTON,
INVENTOR
BY Henry Hyman
ATTORNEY

United States Patent Office 2,843,743
Patented July 15, 1958

2,843,743

PULSE GENERATOR

Douglas J. Hamilton, Santa Monica, Calif., assignor to Hughes Aircraft Company, Culver City, Calif., a corporation of Delaware Application November 4, 1955, Serial No. 544,963
7 Claims. (Cl. 250—36)

Figure 1:
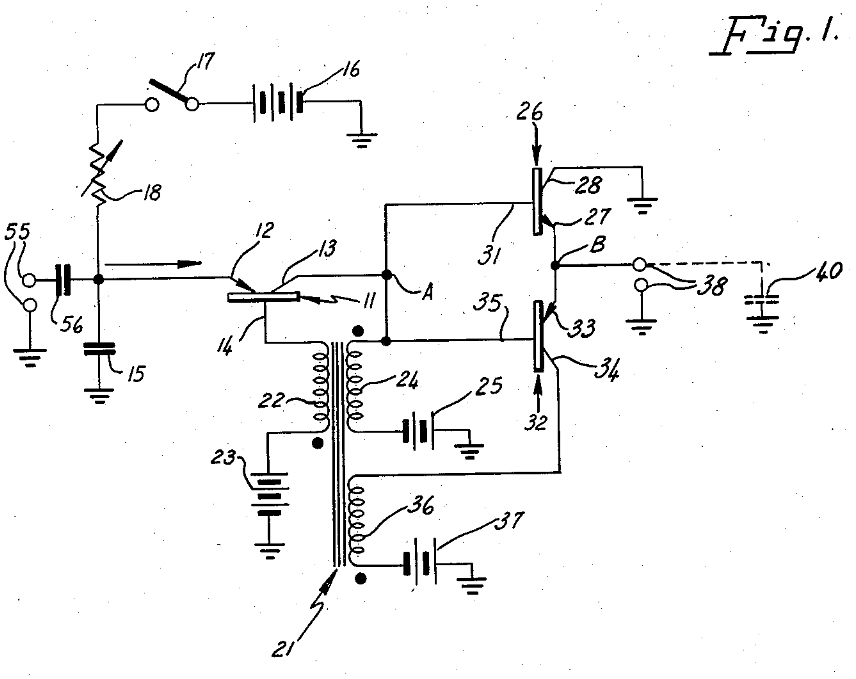

This invention relates generally to signal generators and, more particularly, to transistor pulse generators for producing pulses of a short duration which have rapid rise and fall times.

There are many applications where a signal generator which produces sharp pulses of voltage or current is necessary. One such application would be a generator for producing master timing signals in certain systems referred to as clock pulses for use in digital computers. Another application may be for use in a radar system as a range rate generator. In virtually all applications such a generator must drive a load which is predominantly capacitive such as coupling into a flip-flop, amplifier or other circuit or device.

In the present state of the art, one method of generating pulses of the type described is by using a vacuum tube blocking oscillator. Circuits of this type are shown and fully considered in Chapter 6 beginning on page 205 of Radiation Laboratory Series, volume 19, entitled, "Waveforms," published in 1949 by McGraw-Hill Book Company, Inc., New York, New York. Another method of generating these pulses is by using a transistor blocking oscillator followed by a grounded collector transistor amplifier to provide current gain. In either case the generator causes current to flow into the load only and if the load is predominantly capacitive the desired steep leading and trailing edges of the pulse will be impaired because the discharge time of the load capacitance is determined by the capacitance of the load and the resistance of the generator. If the leading or trailing edges are allowed to slope, the timing which the pulses are to accomplish may be destroyed or caused to vary substantially from that which is desired.

Accordingly, an object of the present invention is to provide a novel means for producing substantially rectangular output pulses which have fast rise and fall times.

Another object of the present invention is to provide a pulse generator for driving a predominantly capacitive load which produces pulses having fast rise and fall times.

A further object of the present invention is to provide a transistor pulse generator which will provide pulses of relatively short duration having fast rise and fall times for driving a predominantly capacitive load without unduly loading the generator through the charge and discharge of the load capacitor.

A pulse generator in accordance with the present invention comprises first and second relaxation oscillators having connected therebetween means for amplifying the output signal of the first oscillator and controlling the occurrence of oscillation of the second oscillator.

The first oscillator is caused to produce an output signal in response to a frequency control network which is connected to its input. This output signal is amplified and applied to a load. During the termination of the output signal from the first oscillator, the second oscillator begins to conduct. This discharges any current which has previously been stored in the load capacitance without impairing the rapid fall time of the output signal.

Figure 2:
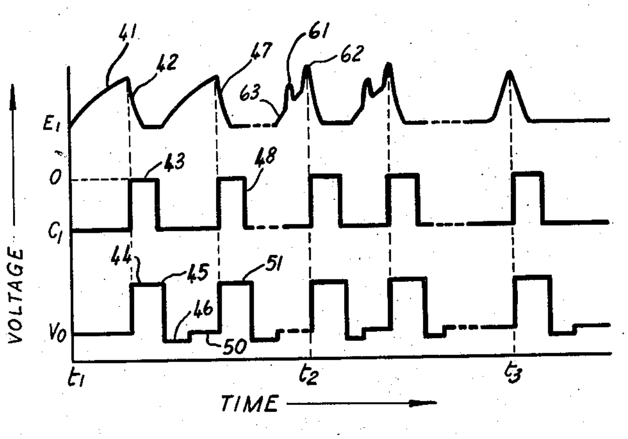

The novel features of the present invention are set forth in particularity in the appended claims. Other and more specific objects of the invention will become apparent from a consideration of the following description taken in connection with the accompanying drawing in which:

Fig. 1 is a schematic circuit diagram of the pulse generator of the present invention; and Fig. 2 is a graph illustrating waveforms taken at variout points throughout the circuit of Fig. 1.

Referring now to the drawing and, more particularly, to Fig. 1, there is shown a transistor 11 having an emitter 12, a collector 13, and a base 14 represented by its accepted schematic symbol and is in the presently preferred embodiment a P–N–P point contact type transistor. A capacitor 15 is connected between emitter 12 and ground. A source of potential such as battery 16 has its negative terminal grounded. A switch 17 and a resistor 18 are connected in series between the positive terminal of battery 16 and emitter 12. Switch 17 is used to initiate operation of the circuit shown in Fig. 1.

The occurrence of oscillations of transistor 11 and its associated circuit is controlled by the RC time constant of resistor 18 and capacitor 15. In order to vary this time constant, resistor 18 may be adjustable as shown in the presently preferred embodiment. Feedback means such as transformer 21 is connected between collector 13 and base 14 in order to provide a regenerative feedback circuit for transistor 11. Transformer 21 has a first winding 22 which is connected to base 14 of transistor 11. A source of operating potential such as battery 23 has its positive terminal connected to first winding 22 and its negative terminal to ground. A second winding 24 of transformer 21 is connected to collector 13. Another source of operating potential such as battery 25 has its positive terminal connected to ground and its negative terminal connected to winding 24.

A second transistor 26 having an emitter 27, a collector 28, and a base 31 is represented by its accepted schematic symbol and in the presently preferred embodiment is shown as an N–P–N transistor and is of the junction type. A third transistor 32 having an emitter 33, a collector 34, and a base 35 is shown by its accepted schematic symbol to be a P–N–P transistor and is, in the presently preferred embodiment, a point contact transistor.

Base 31, base 35, and collector 13 are interconnected at common junction point A. Emitters 27 and 33 of transistors 26 and 32, respectively, are connected together at common junction point B, while collector 28 is connected to ground. Collector 34 is connected to one side of a third winding 36 of transformer 21. A further source of operating potential such as battery 37 has its positive terminal connected to ground and its negative terminal connected to the other side of winding 36. An output signal from the circuit of Fig. 1 may be taken at output terminals 38, one of which is grounded, the other being connected to common point B. A capacitor 40 shown in dotted lines and connected between point B and ground may represent the load although it is to be understood that the load need not be capacitive.

In discussing the operation of the circuit of Fig. 1, reference is now made to Fig. 2 wherein the abscissa represents time and the ordinate voltage. Curve $V_0$ is taken by measuring across output terminals 38. Curve $C_1$ is taken by measuring between common junction point A and ground, while curve $E_1$ was taken by measuring between emitter 12 and ground.

In quiescent condition, that is, when switch 17 is open, transistors 11, 26, and 32 are non-conducting because the circuit containing emitter 12 is open due to switch 17 being open and emitters 27 and 33 are open circuited since the load connected to terminals 38 is essentially an open circuit and, therefore, no output signal appears at terminals 38. If at some time $t_1$ as shown on Fig. 2, switch 17 is closed, current begins to flow from battery 16 through resistor 18 and capacitor 15 to ground. This current flow begins to charge capacitor 15 positive with respect to ground as shown at 41 on curve $E_1$. When the charge on capacitor 15 becomes equal to or slightly more positive than the potential impressed on base 14 by battery 23, the emitter-base diode section of transistor 11 becomes forward biased and current begins to flow through transistor 11, discharging capacitor 15 as shown at 42 in Fig. 2.

As current flows from collector 13 through winding 24 of transformer 21, a magnetic flux is set up in winding 24 and a voltage induced therein which is positive at the polarity mark shown on winding 24. Through normal transformer action a voltage is induced in winding 22 which is negative at base 14 as indicated by the polarity marking on winding 22. This causes base 14 to be even more negative than emitter 12 which, in turn, causes a greater amount of current to flow through transistor 11. This increased current flow causes a greater difference in potential between base 14 and emiter 12. It is, therefore, seen that a regenerative action is set up which causes transistor 11 to change from its nonconducting to its conducting state almost simultaneously.

This regenerative current flow causes collector 13 to rise from the negative potential impressed thereon by battery 25 toward ground potential as shown at 43 on Fig. 2. As this occurs, base 31 of transistor 26 and base 35 of transistor 32 also rise since they are interconnected with collector 13. When the potential level on the base 31 reaches a predetermined level, that is, when it becomes slightly more positive than the potential of the emitter 27, the transistor 26 is rendered conducting. When the potential level on base 31 becomes equal to or slightly more positive than that of collector 28, that is, ground potential, the collector-base diode section of transistor 26 becomes forward biased, that is, transistor 26 goes immediately into saturation. Transistor 32 remains nonconducting since emitter 33 and base 35 are maintained essentially at the same potential due to the saturated condition of transistor 26.

The conduction of transistor 26 performs two functions, first it clamps collector 13 of transistor 11 essentially to ground potential neglecting the voltage drop across the base-collector diode section of transistor 26 which is negligible. Second, it drives current into any load which may be connected to terminals 38. Assuming that such a load is predominantly capacitive in nature, as shown by capacitor 40, it will be quickly charged by the action of the circuit thus far described.

When transformer 21 saturates magnetically, or when capacitor 15 can no longer supply current to maintain that conduction through transistor 11 which is determined by transformer 21 and transistor 11, transistor 11 begins to turn off, that is, become non-conducting regeneratively due to the transformer action as above described but with reversed polarities. When this occurs, collector 13, along with base 31 and base 35, begins to fall toward the negative potential of battery 25. However, emitters 27 and 33 will not immediately follow the drop in potential on base 31 as they would under normal conditions because of the minority carrier storage phenomenon due to the saturation of transistor 26 and capacitance such as capacitor 40. When base 35 becomes slightly negative with respect to its associated emitter 33, transistor 32 begins to conduct, causing current to flow through collector 34 and into winding 36 of transformer 21. After the duration of the minority carrier storage time, transistor 26 becomes completely non-conducting.

The flow of current through winding 36 induces a voltage in both windings 22 and 24. The voltage induced in winding 24 applies a more negative potential to base 35 of transistor 32, causing even greater conduction to occur. The greater current conduction causes a greater voltage of the same polarity to be developed and applied to base 35 to further increase conduction. It is, therefore, seen that regeneration occurs causing a heavy current flow from capacitor 40 and into emiter 33 thus discharging the capacitive load 40 extremely rapidly.

During the time transistor 32 is conducting, the potential level present at output terminals 38 drops below the quiescent level as shown at 46 on Fig. 2. This is due to the fact that the potential of battery 37 is slightly more negative than that of battery 25. However, when the load capacitor 40 is discharged as transformer 21 becomes magnetically saturated once more, transistor 32 regeneratively turns off and the potential level at output terminals 38 returns to its quiescent value 50.

The voltage induced in winding 22 applies a positive potential to base 14 of transistor 11 which aids this transistor in its regenerative turnoff. However, the voltage induced in winding 22 from winding 36 has only a secondary effect since the primary regeneration turnoff potential is produced by the collapse of the magnetic field built up around winding 24 due to the initial conduction of transistor 11 as hereinabove explained.

So long as switch 17 remains closed, the cycle of events above described will periodically repeat as shown by waveforms 47, 48, and 51, thus producing output pulses. If desirable the circuit of Fig. 1 may be triggered to produce pulses prior to the time they would normally occur. To accomplish this, an input signal may be impressed through input terminals 55 and capacitor 56 to emitter 12 of transistor 11. This would produce waveforms at the various points throughout the circuit as shown between $t_2$ and $t_3$ on Fig. 2. The applied trigger pulses 61 and 62 are superimposed upon the normal charge curve 63 of capacitor 15 and as the combination of the trigger pulse plus the charge of capacitor 15 causes emiter 12 to become more positive than base 14, the regenerative cycle hereinbefore described would occur. The circuit may also be directly triggered as shown by the waveforms following $t_3$ on Fig. 2. If the circuit is to be directly triggered, emitter 12 must be biased slightly negative with respect to base 14 during non-oscillatory periods. This may be accomplished by replacing resistor 18, switch 17, and battery 16 with a voltage divider and connecting emitter 12 at that point to impress the desired potential upon it.

It is therefore seen that current is caused to flow in two directions by a driving element. The current is first caused to flow into the load by the conduction of the blocking oscillator which uses transistor 11 as its active circuit element and is then caused to flow out of the load by the blocking oscillator utilizing transistor 32 as its active element. By driving current both into and out of the load, extremely fast rise and fall times of the output pulses are obtained. By use of the components as listed below, rise and fall times of 0.3 microsecond on a one-microsecond pulse were obtained while driving a capacitive load such as 40 of approximately .01 microfarad.

The pulse width is determined by the capacitance of capacitor 15 and the inductance of winding 22 connected in the emitter-base circuit of transistor 11. Capacitor 15 could be made variable in any particular application wherein it would be desirable to vary the pulse width of the output signal.

It will be understood that circuit specifications for the pulse generator of the present invention may vary according to the design for any particular application. The following circuit specifications are included for a pulse generator by way of illustration only which are suitable for a generator having a pulse recurrence frequency of 180 kilocycles per second.

| | |
|---|---|
| Transistors **11** and **32** | Transistor Products Co. point contact P–N–P transistor, type 2G. |
| Transistor **26** | Hughes Aircraft Co. developmental N–P–N junction transistor Class II |
| Resistor **18** | 7,500 ohms. |
| Capacitor **15** | 360 micro-microfarads. |
| Transformer **21** | Pacific Coast Associates type PCA–111–0.5. |
| Battery **16** | 25 volts. |
| Battery **23** | 18 volts. |
| Battery **25** | 10 volts. |
| Battery **37** | 11 volts. |

It is to be understood that N–P–N transistors may be exchanged for the P–N–P transistors 11 and 32 as shown in the preferred embodiment of the present invention and that a P–N–P transistor may be used instead of the N–P–N transistor 26 if all voltages and currents as above described are reversed in their polarities.

There has been thus disclosed a preferred embodiment of a transistor pulse generator which will produce pulses having rapid rise and fall times while driving a load predominantly capacitive in nature.

What is claimed is:

1. A pulse generator comprising: a first oscillator including a first input and a first output circuit; a second oscillator including a second input and a second output circuit, each of said oscillators having at least one quasi-stable state; a pair of output terminals; a signal translating device having a third input and a third output circuit, said third output circuit being connected across said pair of output terminals, said third input circuit being connected to said first output circuit for rendering said signal translating device operative to transfer the signal developed in the output circuit of said first oscillator to said output terminal during the increments of time that said first oscillator is in its quasi-stable state; means for rendering said signal translating device inoperative to translate signals during the increments of time that said first oscillator is not in said quasi-stable state, said second output circuit being connected across said output terminals; circuit means coupled between said second input circuit and said third input circuit for triggering said second oscillator into its quasi-stable state when said signal translating device is rendered inoperative.

2. A pulse generator comprising: a first transistor oscillator including a first input and a first output circuit; a second transistor oscillator including a second input and a second output circuit, each of said oscillators including regenerative feedback means and having at least one quasi-stable state; a pair of output terminals; a third transistor having a third input and a third output circuit, said third output circuit being connected across said pair of output terminals, said third input circuit being connected to the output circuit of said first oscillator for rendering said third transistor conducting during the increments of time that said first oscillator is in its quasi-stable state, said second output circuit being coupled across said output terminals; circuit means coupled between said second input circuit and said first output circuit for triggering said second oscillator into its quasi-stable state when said third transistor is rendered nonconducting.

3. A pulse generator comprising: a first oscillator including an output circuit and having first and second states of operation, said first state of operation being quasi-stable; means coupled to said first oscillator for controlling the pulse recurrence frequency of said first oscillator; a pair of output terminals; a variable and controllable impedance device having an input circuit and an output circuit, the impedance across the output circuit of said impedance device varying in accordance with the amplitude of the instantaneous signal applied across the input circuit of said impedance device, the output circuit of said impedance device being connected across said output terminals, the input circuit of said impedance device being connected to the output circuit of said first oscillator for establishing a low impedance across said output terminals during the time interval that said first oscillator is in said first state of operation, said impedance device being adapted to establish a high impedance across said output terminals during the time interval that said first oscillator is in said second state of operation; and a second oscillator under the control of said impedance device and connected across said output terminals for applying an output signal across said terminals in response to said first oscillator changing from said first to said second state of operation.

4. A transistor pulse generator comprising: a first blocking oscillator including a first transistor, said first transistor including a first emitter, a first base and a first collector; a second blocking oscillator including a second transistor, said second transistor including a second emitter, a second base and a second collector; a third transistor including a third emitter, a third base and a third collector; a pair of output terminals, said third emitter being connected to one of said output terminals and said third collector being connected to the other of said output terminals, said third base being connected to said first collector for rendering said third transistor conducting when the signal developed at said first collector reaches a predetermined value, said second emitter being connected to said one output terminal, said second base being connected to said third base for maintaining said second transistor nonconducting during the time interval that said third transistor is conducting and for rendering said second transistor conducting to apply an output signal across said output terminals when said third transistor is rendered nonconducting; and means connected to said first emitter for controlling the occurrence of conduction of said first transistor, whereby said third transistor will establish a low impedance across said output terminals when said third transistor is conducting and said second transistor will apply an output signal across said output terminals when said third transistor is rendered nonconducting.

5. The pulse generator defined in claim 4 wherein said first and third transistors are point-contact transistors and said second transistor is a junction transistor.

6. The pulse generator defined in claim 4 including a transformer having first, second and third windings, said first winding being connected in series with said first base, said second winding being connected in series with said first collector for providing a regenerative feedback between said first collector and said first base, and said third winding being connected in series with said third collector for providing regenerative feedback between said third collector and said third base.

7. The pulse generator as defined in claim 4 wherein said means for controlling the occurrence of conduction of said first transistor includes a capacitor and a resistor connected in series with a source of potential.

References Cited in the file of this patent

UNITED STATES PATENTS

| | | |
|---|---|---|
| 2,745,012 | Filker | May 8, 1951 |
| 2,582,603 | Phelan | Jan. 15, 1952 |
| 2,589,085 | Houghton | Mar. 11, 1952 |
| 2,638,549 | Woodbury | May 12, 1953 |